United States Patent
Sasaki et al.

(10) Patent No.: US 8,107,278 B2
(45) Date of Patent: Jan. 31, 2012

(54) SEMICONDUCTOR STORAGE DEVICE

(75) Inventors: Takahiko Sasaki, Nerima-ku (JP); Atsushi Kawasumi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 554 days.

(21) Appl. No.: 12/328,637

(22) Filed: Dec. 4, 2008

(65) Prior Publication Data

US 2009/0147561 A1   Jun. 11, 2009

(30) Foreign Application Priority Data

Dec. 5, 2007   (JP) ................. 2007-314942

(51) Int. Cl.
*G11C 11/00* (2006.01)
*G11C 8/00* (2006.01)

(52) U.S. Cl. ............... 365/154; 365/156; 365/230.05
(58) Field of Classification Search .......... 365/154, 365/230.05, 203, 156
See application file for complete search history.

(56) References Cited

U.S. PATENT DOCUMENTS

| 4,791,613 | A | 12/1988 | Hardee | |
|---|---|---|---|---|
| 6,711,051 | B1 | 3/2004 | Poplevine et al. | |
| 7,116,574 | B2 * | 10/2006 | Sugahara et al. | 365/156 |
| 7,924,605 | B2 * | 4/2011 | Fujimoto | 365/154 |

OTHER PUBLICATIONS

The Asynchronous 24mb On-chip Level 3 Cache for a Dual-Core Itanium Family Processor. John Wuu, et al.

* cited by examiner

*Primary Examiner* — Anh Phung
(74) *Attorney, Agent, or Firm* — Turocy & Watson, LLP

(57) ABSTRACT

A semiconductor storage device includes a memory cell array having a plurality of SRAM cells arranged along a pair of bit lines that extend along a first direction. A read circuit is arranged for each column at one side of the memory cell array and detects a potential of any one of the pair of bit lines. A write circuit is arranged, separately from the read circuit, at the other side of the memory cell array. The write circuit provides written data to the pair of bit lines to write data to the SRAM cells.

6 Claims, 5 Drawing Sheets

SEMICONDUCTOR STORAGE DEVICE

CROSS REFERENCE TO RELATED APPLICATIONS

This application is based on and claims the benefit of priority from prior Japanese Patent Application No. 2007-314942, filed on Dec. 5, 2007, the entire contents of which are incorporated herein by reference.

BACKGROUND OF THE INVENTION

1. Field of the Invention

The present invention relates to a semiconductor storage device.

2. Description of the Related Art

As the recent increase in capacity of SRAMs, the number of memory cells connected to one bit line has also increased, providing greater impact on the SRAMs due to bit-line capacitance. A large bit-line capacitance could cause adverse effects, such as a delay in changing potentials of the bit lines in read operation or corruption of retained data in memory cells due to disturbance, etc. If the bit lines are divided into short sections to prevent such adverse effects, the area occupied by sense amplifier circuits becomes larger in the SRAM, which would present difficulties in achieving higher capacity.

To this extent, a so-called "single-bit-line reading architecture" is known to detect the potential of only one of a pair of bit lines while dividing bit lines into short sections, instead of providing a sense amplifier circuit of differential amplifier type for differentially amplifying the potentials of a pair of bit lines, as disclosed in, e.g., "The Asynchronous 24 MB On-Chip Level-3 Cache for a Dual-Core Itanium®-Family Processor" (2005 ISSCC). In this publication, the single-bit-line reading architecture is employed in the SRAM, wherein a read circuit and a write circuit are arranged in the same area in the center of cell arrays and a plurality of columns are connected to a single read circuit and write circuit.

Column switches that connect the respective read and write circuits to the corresponding columns have very large impact on the reading speed. Therefore, in accelerating reading operations, a read circuit and a write circuit are required for each column in order to omit the column switches. In this case, however, it becomes more difficult to achieve reduction in area due to the increased wiring congestion. In addition, the bit lines also have higher wiring density and become longer than required, which would result in a larger bit-line capacitance and degradation in performance of the SRAM.

SUMMARY OF THE INVENTION

One aspect of the present invention provides a semiconductor storage device comprising: a memory cell array having a plurality of SRAM cells arranged along a pair of bit lines, the pair of bit lines extending along a first direction; a read circuit arranged for each column at one side of the memory cell array with respect to the first direction and detecting a potential of any one of the pair of bit lines; and a write circuit arranged, separately from the read circuit, at the other side of the memory cell array with respect to the first direction, and providing written data to the pair of bit lines to write data to the SRAM cells.

DETAILED DESCRIPTION OF THE EMBODIMENTS

An embodiment of the present invention will now be described in detail below with reference to the accompanying drawings.

Figure 1:
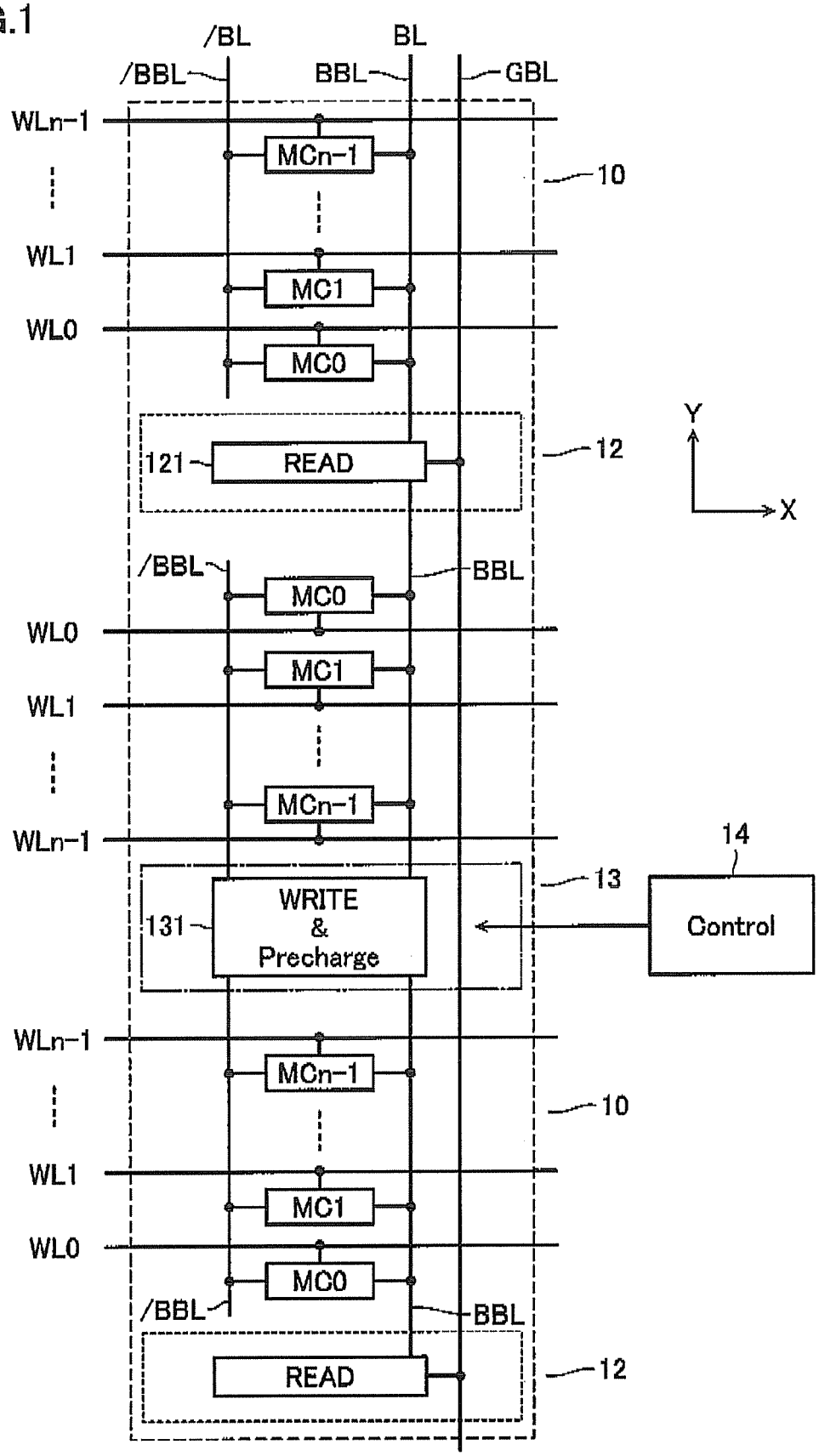
FIG. 1 illustrates a plane layout of a memory macro part of an SRAM for each column according to an embodiment of the invention.

FIG. 1 illustrates a plane layout of a memory macro part of an SRAM for each column according to this embodiment. That is, FIG. 1 illustrates, for example, one of 64 sub-arrays included in a memory cell array 10 that resides along a pair of bit lines BL and /BL.

The SRAM has a plurality of memory cells MCi (SRAM cells) arranged along the pair of bit lines BL and /BL. For example, the pair of bit lines BL and /BL are divided in the extending direction for 16 memory cells MCi (i=0 to 15), in which one column is configured by each resulting pair of divided bit lines BBL and /BBL.

In addition, the memory cells MCi are connected to respective word lines WLi that are arranged along a direction orthogonal to the pair of bit lines BL and /BL. One read circuit 12 and one write circuit 13 are provided for 16 memory cells MCi that configure one column. That is, a read circuit 12 is provided at one end of the pair of divided bit lines BBL and /BBL in the extending direction (y-axis direction in FIG. 1). The read circuit 12 comprises a detection circuit 121 that is connected to any one of the pair of divided bit lines BBL and /BBL. This means that the detection circuit 121 employs the so-called single-bit-line reading architecture and that it is configured to be able to autonomously read data retained in the memory cells MC for each column at any time without being controlled by a control circuit. The configuration of the detection circuit 121 will be discussed later.

On the other hand, a write circuit 13 is provided at the opposite side of the read circuit 12 with respect to the pair of divided bit lines BBL and /BBL in the Y-axis direction. The write circuit 13 is arranged in an area separated from that of the read circuit 12. The write circuit 13 comprises a write and precharge circuit 131 that precharges the pair of divided bit lines BBL and /BBL to predetermined potentials before reading and writes data to the memory cells MCi. A control circuit 14 is provided for controlling the write circuit 13. In this embodiment, the read circuit 12 comprises the detection circuit 121 under the single-bit-line reading architecture. The read circuit 12 is not required to be controlled by a control circuit. In addition, the write circuit 13 may be arranged at the opposite end of, and separately from, the read circuit 12 across each memory cell array 10. This allows for shorter bit lines and prevents any wiring congestion, which may reduce bit-line capacitance, accordingly.

Figure 2:
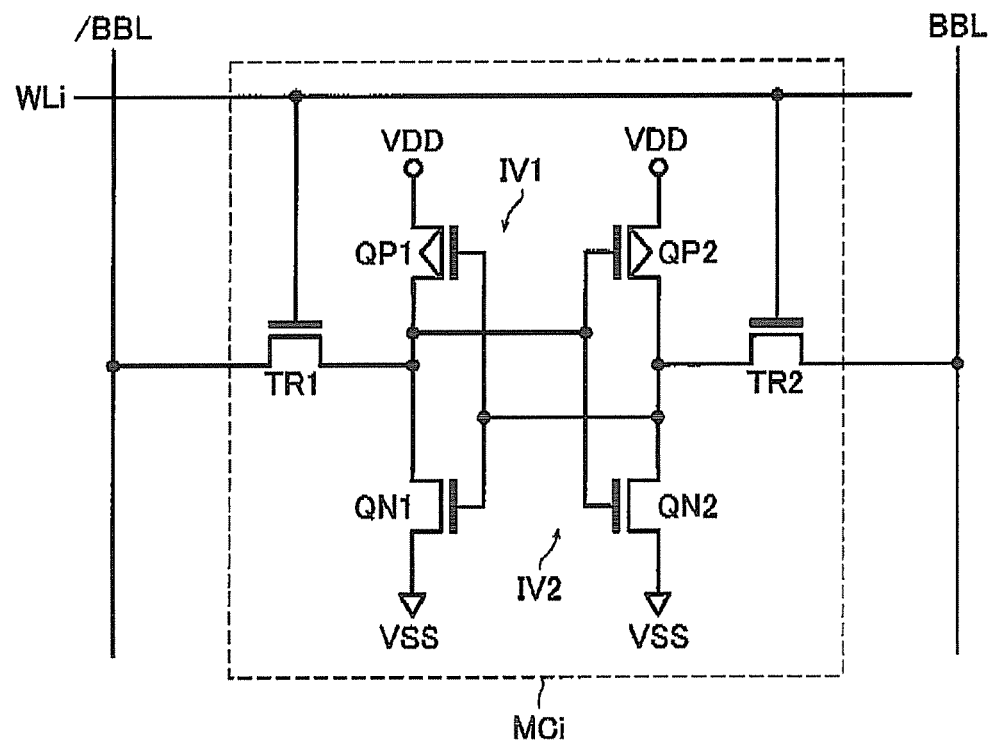
FIG. 2 is a circuit diagram illustrating an example configuration of one memory cell MCi illustrated in FIG. 1.

FIG. 2 is a circuit diagram illustrating an example configuration of one memory cell MCi illustrated in FIG. 1. The memory cell MCi has a first inverter IV1, a second inverter IV2, a first transfer transistor TR1, and a second transfer transistor TR2.

The first inverter IV1 is a CMOS inverter that has a p-type MOS transistor QP1 and an n-type MOS transistor QN1 connected in series between the power supply voltage VDD and the ground voltage VSS, the gates of which transistors are connected to each other. The second inverter IV2 is a CMOS inverter that has a p-type MOS transistor QP2 and an n-type MOS transistor QN2 connected in series between the power supply voltage VDD and the ground voltage VSS, the gates of which transistors are connected to each other. Each of these two inverter circuits IV1 and IV2 has an output terminal connected to an input terminal of the other.

The first transfer transistor TR1 has its gate connected to a word line WL, its drain to a divided bit line /BBL, and its source to the output terminal of the first inverter IV1. In addition, the second transfer transistor TR2 has its gate connected to the word line WL, its drain to a divided bit line BBL, and its source to the output terminal of the second inverter IV2.

Figure 3:
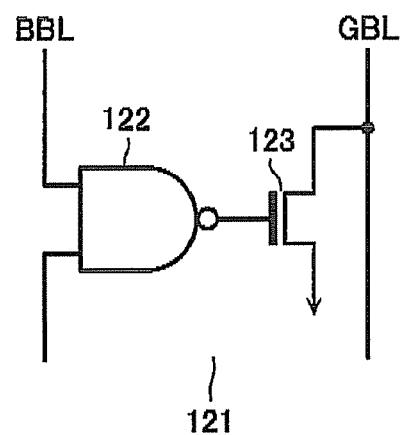
FIG. 3 illustrates an example configuration of the detection circuit 121 in the read circuit 12.

Referring now to FIG. 3, an example configuration of the detection circuit 121 in the read circuit 12 will be described below. The detection circuit 121 comprises a NAND gate 122 and an n-type MOS transistor 123. The NAND gate 122 has its input terminal connected to any one of the divided bit lines BBL and /BBL ("BBL" in FIG. 3).

In addition, the n-type MOS transistor 123 has its gate connected to the output terminal of the NAND gate 122 and its drain to a global bit line GBL. Further, the source of the n-type MOS transistor 123 is grounded. In this configuration, if the data read from the memory cell MCi is "0", then the divided bit line BBL changes from "H" of a precharged state down to "L". As a result, the output signal from the NAND gate 122 changes from "L" to "H". Accordingly, the transistor 123 turns on and the potential of the global bit line GBL also changes from "H" to "L". Alternatively, if the data read from the memory cell MCi is "1", then the potential of the global bit line GBL remains "H". By determining this at a determination circuit (not illustrated) connected to the global bit line GBL, data can be read from the memory cell MCi.

Figure 4:
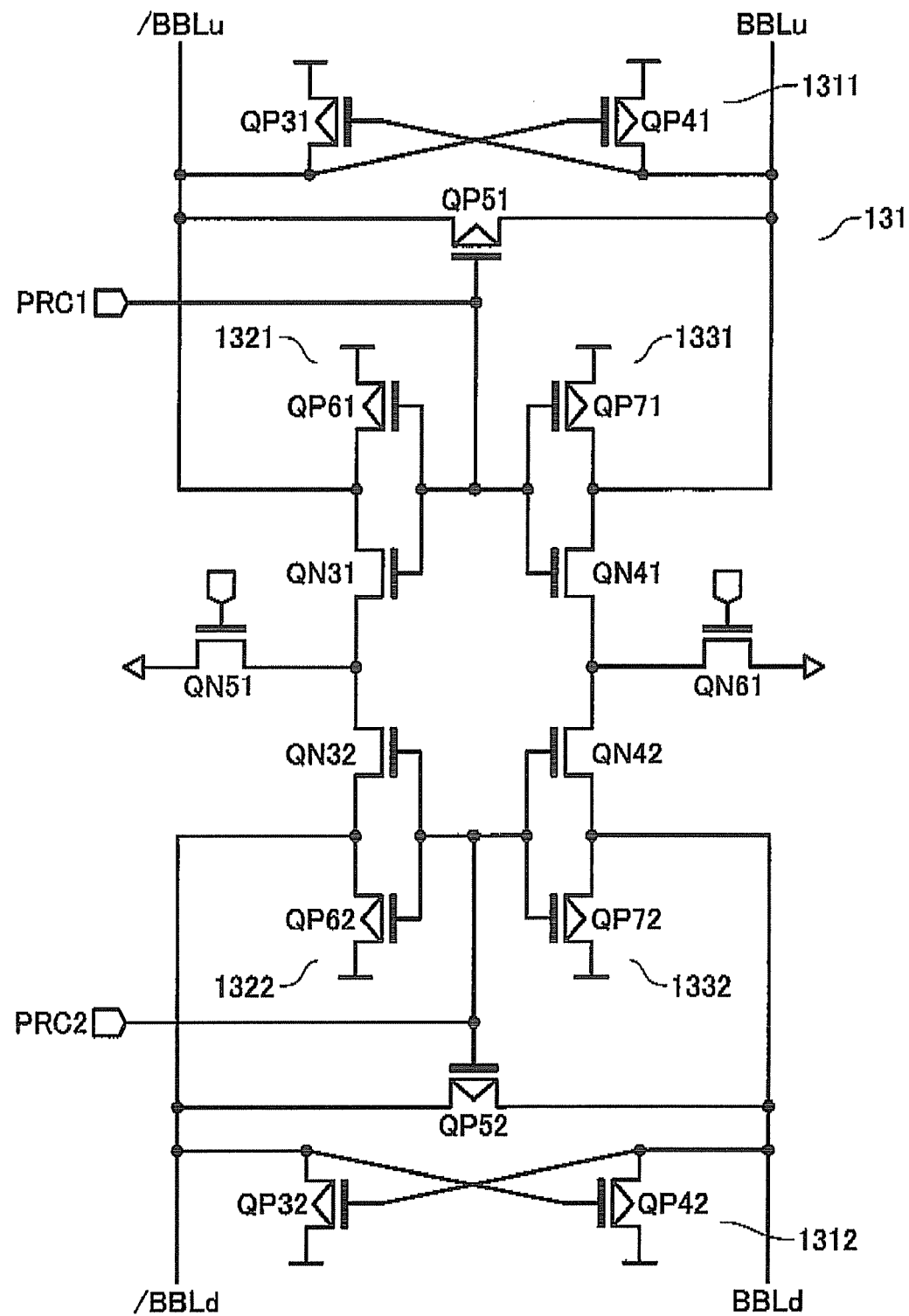
FIG. 4 illustrates an example configuration of the write and precharge circuit 131 in the write circuit 13.

Referring next to FIG. 4, an example configuration of the write and precharge circuit 131 in the write circuit 13 will be described below. The write and precharge circuit 131 is shared between two pairs of divided bit lines BBL and /BBL that reside above and below itself. That is, the write and precharge circuit 131 comprises p-type MOS transistors QP31, QP41 and QP51 that configure a precharge circuit 1311 for precharging potentials of the upper pair of bit lines BBLu and /BBLu. Both the p-type MOS transistors QP31 and QP41 have their sources connected to the power supply voltage VDD and their drains to the pair of divided bit lines BBLu and /BBLu, respectively. In addition, each of the p-type MOS transistors QP31 and QP41 has its gate cross-connected to the drain of the other. Further, the p-type MOS transistor QP51 is connected between the divided bit lines BBLu and /BBLu. The gate of the p-type MOS transistor QP51 is supplied with a precharge signal PRC1. The precharge signal PRC1 becomes "L" for a period during which precharging is performed and "H" for other periods.

In addition, the write and precharge circuit 131 comprises p-type MOS transistors QP61 and QP71 as well as n-type MOS transistors QN31 and QN41 that configure the inverter circuits 1321 and 1331 for writing data. The transistors QP61 and QN31 together configure one CMOS inverter circuit 1321. In addition, the transistors QP71 and QN41 together configure one CMOS inverter circuit 1331. The inverter circuits 1321 and 1331 have input terminals to which the precharge signal PRC1 is input and output terminals which are connected to the respective divided bit lines BBLu and /BBLu. The sources of the n-type MOS transistors QN31 and QN41 are connected to the respective n-type MOS transistors QN51 and QN61. These two transistors QN51 and QN61 complementarily turn on in response to the written data, by which data "1" or "0" is written to a selected memory cell.

In addition, a precharge circuit 1312 as well as inverter circuits 1322 and 1332 are provided at the lower pair of divided bit lines BBLd and /BBLd, each of which has the same configuration as the precharge circuit 1311 as well as the inverter circuits 1321 and 1331, respectively, that are provided at the upper pair of divided bit lines BBLu and /BBLu. In FIG. 4, those components (QP31 and QP32) with the same reference numeral but the last digit (1 or 2) represent the same components.

Conventionally, the read circuit 12 and the write circuit 13 are not separated and arranged in the same area. In such layouts, even if the single-bit-line reading architecture is employed in the read circuit 12, wiring congestion occurs in the bit lines BL and /BL in the area of the read circuit 12, which may increase the bit-line capacitance. To this extent, in this embodiment, the single-bit-line reading architecture is employed in the read circuit 12, which is provided for each column, thereby avoiding the need for controlling the read circuit 12. Accordingly, the control circuit 14 needs to be provided only at the side of the write circuit 13 and hence the read circuit 12 and the write circuit 13 may be arranged separately from each other. Therefore, this allows for shorter wiring, which cannot increase the bit-line capacitance.

Figure 5:
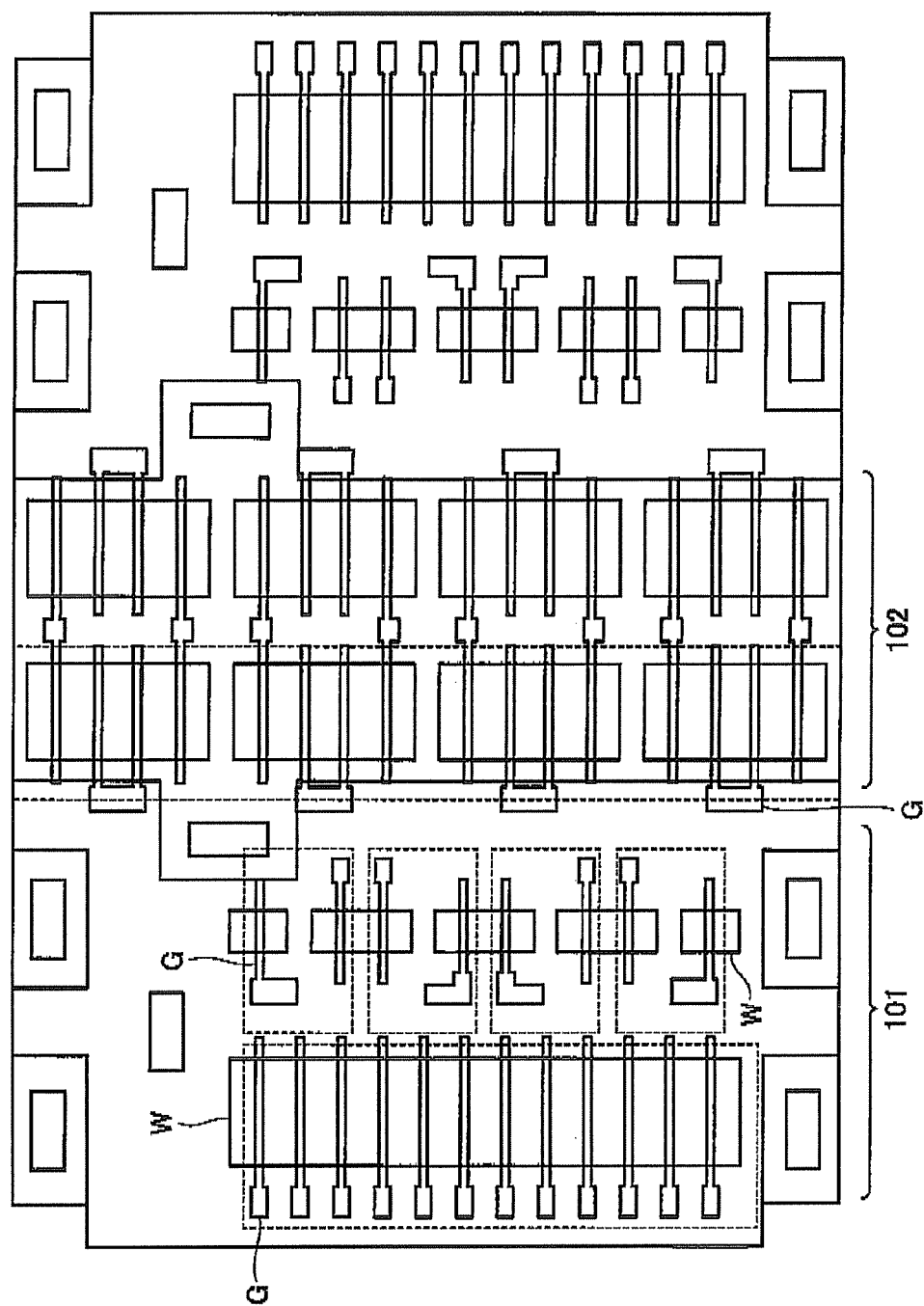
FIG. 5 illustrates an actual layout of a memory macro of the SRAM illustrated in FIG. 1, in particular, an actual layout near the write circuit 13.

FIG. 5 illustrates an actual layout of a memory macro of the SRAM illustrated in FIG. 1, in particular, an actual layout near the write circuit 13. In FIG. 5, the reference numeral "101" represents an area where the precharge circuits 1311 and 1312 illustrated in FIG. 4 are formed, while "102" represents another where the n-type MOS transistors are formed that configure the inverters 1321, 1331, 1322 and 1332 illustrated in FIG. 4.

As illustrated in FIG. 5, those components in each area, such as wells W, diffusion areas (active areas), or gate electrodes G are mostly arranged in a line along respective edges, so that they have less impact on the devices' characteristics (such as tolerance to disturbance, etc.) when any deviations occur in photolithography process.

Figure 6:
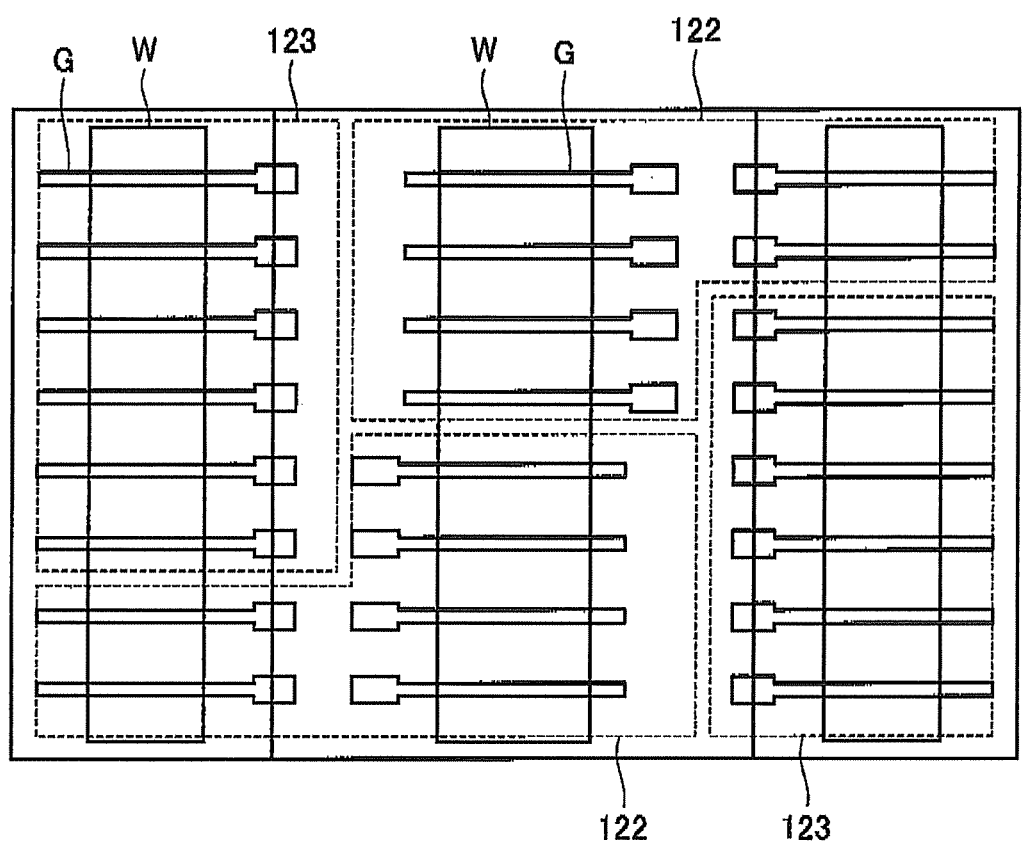
FIG. 6 illustrates an example of an actual layout of the read circuit 12.

FIG. 6 illustrates an example of an actual layout of the read circuit 12. In this case, while NAND gates 122 and n-type MOS transistors 123 are positioned symmetrically with respect to a point in the layout, those components, such as wells W, gate electrodes G, or the like in respective devices are also positioned in a line, so that they have less impact on the devices' characteristics (such as tolerance to disturbance, etc.) when any deviations occur in photolithography process.

While embodiments of the present invention have been described, the present invention is not intended to be limited to the disclosed embodiments and various other changes, additions or the like may be made thereto without departing from the spirit of the invention.

What is claimed is:
1. A semiconductor storage device comprising:
a memory cell array having a plurality of SRAM cells arranged along a pair of bit lines, the pair of bit lines extending along a first direction;
a read circuit arranged for each column at one side of the memory cell array with respect to the first direction and detecting a potential of any one of the pair of bit lines; and
a write circuit arranged, separately from the read circuit, at the other side of the memory cell array with respect to the first direction, and providing written data to the pair of bit lines to write data to the SRAM cells,
wherein the write circuit comprises:
a first inverter circuit having a first p-type MOS transistor and a first n-type MOS transistor connected in series and having its output signal connected to one of the pair of bit lines;
a second inverter circuit having a second p-type MOS transistor and a second n-type MOS transistor connected in series and having its output signal connected to the other of the pair of bit lines;
a third n-type MOS transistor having its one end connected to the source of the first n-type MOS transistor; and
a fourth n-type MOS transistor having its one end connected to the source of the second n-type MOS transistor, and wherein
the third n-type MOS transistor and the fourth n-type MOS transistor become selectively conductive based on a complementary signal.

2. The semiconductor storage device according to claim 1, wherein
the write circuit includes a precharge circuit that precharges potentials of the pair of bit lines to predetermined potentials, and wherein
the precharge circuit comprises:
a first p-type MOS transistor having a source to which a power supply voltage is supplied, a drain connected to one of the pair of bit lines, and a gate connected to the other of the pair of bit lines;
a second p-type MOS transistor having a source to which a power supply voltage is supplied, a drain connected to the other of the pair of bit lines, and a gate connected to the one of the pair of bit lines; and
a third p-type MOS transistor having a source connected to the one of the pair of bit lines, a drain connected to the other of the pair of bit lines, and a gate to which a precharge signal is provided.

3. The semiconductor storage device according to claim 1, wherein the read circuit is configured to output a signal to a global bit line that is provided in common to a plurality of columns to read data from the SRAM cells.

4. A semiconductor storage device comprising:
a memory cell array having a plurality of SRAM cells arranged along a pair of bit lines, the pair of bit lines extending along a first direction and segmented at a predetermined interval in the first direction;
a read circuit arranged at one side of the pair of bit lines and detecting a potential of any one of the pair of bit lines; and
a write circuit arranged, separately from the read circuit, at the other side of the pair of bit lines and providing written data to the pair of bit lines to write data to the SRAM cells, wherein
the write circuit comprises:
a first inverter circuit having a first p-type MOS transistor and a first n-type MOS transistor connected in series and having its output signal connected to one of the pair of bit lines;
a second inverter circuit having a second p-type MOS transistor and a second n-type MOS transistor connected in series and having its output signal connected to the other of the pair of bit lines;
a third n-type MOS transistor having its one end connected to the source of the first n-type MOS transistor; and
a fourth n-type MOS transistor having its one end connected to the source of the second n-type MOS transistor, and wherein
the third n-type MOS transistor and the fourth n-type MOS transistor become selectively conductive based on a complementary signal.

5. The semiconductor storage device according to claim 4, wherein
the write circuit includes a precharge circuit that precharges potentials of the pair of bit lines to predetermined potentials, and wherein
the precharge circuit comprises:
a first p-type MOS transistor having a source to which a power supply voltage is supplied, a drain connected to one of the pair of bit lines, and a gate connected to the other of the pair of bit lines;
a second p-type MOS transistor having a source to which a power supply voltage is supplied, a drain connected to the other of the pair of bit lines, and a gate connected to the one of the pair of bit lines; and
a third p-type MOS transistor having a source connected to the one of the pair of bit lines, a drain connected to the other of the pair of bit lines, and a gate to which a precharge signal is provided.

6. The semiconductor storage device according to claim 4, wherein
the read circuit is configured to output a signal to a global bit line that is provided in common to a plurality of columns to read data from the SRAM cells.

* * * * *